(12) United States Patent
Pan et al.

(10) Patent No.: US 7,586,363 B2
(45) Date of Patent: Sep. 8, 2009

(54) DIODE CONNECTED REGULATION OF CHARGE PUMPS

(75) Inventors: Feng Pan, Fremont, CA (US); Jonathan H. Huynh, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/955,237

(22) Filed: Dec. 12, 2007

(65) Prior Publication Data

US 2009/0153231 A1    Jun. 18, 2009

(51) Int. Cl.
H03K 3/01    (2006.01)
(52) U.S. Cl. .................................. 327/537; 327/534
(58) Field of Classification Search ......... 327/534–538, 327/589
See application file for complete search history.

(56) References Cited

U.S. PATENT DOCUMENTS

| | | | |
|---|---|---|---|
| 3,697,860 A | 10/1972 | Baker | |
| 4,511,811 A | 4/1985 | Gupta | |
| 4,583,157 A | 4/1986 | Kirsch et al. | |
| 4,636,748 A | 1/1987 | Latham | |
| 4,736,121 A | 4/1988 | Cini et al. | |
| 4,888,738 A | 12/1989 | Wong et al. | |
| 5,392,205 A | 2/1995 | Zavaleta | |
| 5,436,587 A | 7/1995 | Cernea | |
| 5,508,971 A | 4/1996 | Cernea et al. | |
| 5,563,779 A | 10/1996 | Cave et al. | |
| 5,563,825 A | 10/1996 | Cernea et al. | |
| 5,568,424 A | 10/1996 | Cernea et al. | |
| 5,592,420 A | 1/1997 | Cernea et al. | |
| 5,596,532 A | 1/1997 | Cernea et al. | |
| 5,621,685 A | 4/1997 | Cernea et al. | |
| 5,625,544 A | 4/1997 | Kowshik et al. | |
| 5,693,570 A | 12/1997 | Cernea et al. | |
| 5,969,565 A | 10/1999 | Naganawa | |
| 5,973,546 A | 10/1999 | Le et al. | |
| 6,018,264 A | 1/2000 | Jin | |
| 6,023,187 A | 2/2000 | Camacho et al. | |

(Continued)

FOREIGN PATENT DOCUMENTS

EP    0 382 929 A    8/1990

(Continued)

OTHER PUBLICATIONS

Notification of Transmittal of the International Search Report and the Written Opinion of the International Searching Authority, or Declaration, Application No. PCT/US2008/085429, mailed Feb. 24, 2009, 15 pages.

(Continued)

Primary Examiner—Dinh T. Le
(74) Attorney, Agent, or Firm—Davis Wright Tremaine LLP

(57) ABSTRACT

A circuit including a charge pump and regulation circuitry is described. The output of the charge pump is connected to provide a first output signal that is connectable to drive a load. A diode is connected to provide a second output signal of lower voltage from the first output signal. The regulation circuitry is connected to the second output level and is connectable to the charge pump to regulate its output. The circuit also includes a current source connectable from the second line to ground, where control circuitry connects the current source to the second line when the first line is connected to the load.

18 Claims, 2 Drawing Sheets

U.S. PATENT DOCUMENTS

| | | | |
|---|---|---|---|
| 6,026,002 A | 2/2000 | Viehmann | |
| 6,134,145 A | 10/2000 | Wong | |
| 6,154,088 A | 11/2000 | Chevallier et al. | |
| 6,198,645 B1 | 3/2001 | Kotowski et al. | |
| 6,249,898 B1 | 6/2001 | Koh et al. | |
| 6,314,025 B1 | 11/2001 | Wong | |
| 6,329,869 B1 | 12/2001 | Matano | |
| 6,344,959 B1 | 2/2002 | Milazzo | |
| 6,344,984 B1 | 2/2002 | Miyazaki | |
| 6,370,075 B1 | 4/2002 | Haeberli et al. | |
| 6,404,274 B1 | 6/2002 | Hosono et al. | |
| 6,424,570 B1 | 7/2002 | Le et al. | |
| 6,445,243 B2 | 9/2002 | Myono | |
| 6,456,170 B1 | 9/2002 | Segawa et al. | |
| 6,486,728 B2 | 11/2002 | Kleveland | |
| 6,518,830 B2 | 2/2003 | Gariboldi et al. | |
| 6,525,949 B1 | 2/2003 | Johnson et al. | |
| 6,531,792 B2 | 3/2003 | Oshio | |
| 6,556,465 B2 | 4/2003 | Wong et al. | |
| 6,577,535 B2 | 6/2003 | Pasternak | |
| 6,606,267 B2 | 8/2003 | Wong | |
| 6,724,241 B1 * | 4/2004 | Bedarida et al. | 327/536 |
| 6,734,718 B1 | 5/2004 | Pan | |
| 6,760,262 B2 | 7/2004 | Haeberli et al. | |
| 6,798,274 B2 | 9/2004 | Tanimoto | |
| 6,834,001 B2 | 12/2004 | Myono | |
| 6,859,091 B1 | 2/2005 | Nicholson et al. | |
| 6,891,764 B2 * | 5/2005 | Li | 365/189.15 |
| 6,922,096 B2 | 7/2005 | Cernea | |
| 6,944,058 B2 | 9/2005 | Wong | |
| 6,975,135 B1 | 12/2005 | Bui | |
| 6,990,031 B2 | 1/2006 | Hashimoto et al. | |
| 7,023,260 B2 | 4/2006 | Thorp et al. | |
| 7,030,683 B2 | 4/2006 | Pan et al. | |
| 7,113,023 B2 | 9/2006 | Cernea | |
| 7,116,155 B2 | 10/2006 | Pan | |
| 7,120,051 B2 | 10/2006 | Gorobets et al. | |
| 7,135,910 B2 | 11/2006 | Cernea | |
| 7,227,780 B2 | 6/2007 | Komori et al. | |
| 7,239,192 B2 * | 7/2007 | Tailliet | 327/536 |
| 7,276,960 B2 | 10/2007 | Peschke | |
| 7,397,677 B1 | 7/2008 | Collins et al. | |
| 2005/0248386 A1 | 11/2005 | Pan et al. | |
| 2006/0114053 A1 | 6/2006 | Sohara et al. | |
| 2007/0001745 A1 | 1/2007 | Yen | |
| 2007/0126494 A1 | 6/2007 | Pan | |
| 2007/0139099 A1 | 6/2007 | Pan | |
| 2007/0139100 A1 | 6/2007 | Pan | |
| 2007/0229149 A1 | 10/2007 | Pan et al. | |
| 2008/0024096 A1 | 1/2008 | Pan | |
| 2008/0157852 A1 | 7/2008 | Pan | |
| 2008/0157859 A1 | 7/2008 | Pan | |
| 2008/0239802 A1 | 10/2008 | Thorpe | |
| 2008/0239856 A1 | 10/2008 | Thorpe | |

FOREIGN PATENT DOCUMENTS

| | | |
|---|---|---|
| EP | 0 780 515 A | 6/1997 |
| WO | WO 01/06336 A1 | 1/2001 |

OTHER PUBLICATIONS

Feng Pan et al., "Charge Pump Circuit Design", McGraw-Hill, 2006, 26 pages.

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

\* cited by examiner

Charging Half Cycle

Transfer Half Cycle

DIODE CONNECTED REGULATION OF CHARGE PUMPS

FIELD OF THE INVENTION

This invention pertains generally to the field of charge pumps and more particularly regulation charge pumps using a diode connected regulation scheme.

BACKGROUND

Charge pumps use a switching process to provide a DC output voltage larger than its DC input voltage. In general, a charge pump will have a capacitor coupled to switches between an input and an output. During one clock half cycle, the charging half cycle, the capacitor couples in parallel to the input or power supply voltage so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on flash memory and other non-volatile memories to generate many of the needed operating voltages, such as programming or erase voltages, from a lower power supply voltage. A number of charge pump designs are known in the art and these use a regulation scheme to provide the desired output level. As the accuracy of the output can be important for the application in which it is being used, and as the accuracy of the output level depends on the regulation of the charge pump, there are consequently often needs to improve the ability of the regulation to track the output level.

SUMMARY OF THE INVENTION

In an exemplary embodiment, a circuit including a charge pump and regulation circuitry is described. The output of the charge pump is connected to provide a first output signal that is connectable to drive a load. A diode is connected to provide a second output signal of a lower voltage from the first output signal. The regulation circuitry is connected to the second output level and is connectable to the charge pump to regulate its output based on the second voltage. The circuit also includes a current source connectable from the second line to ground, where control circuitry connects the current source to the second line when the first line is connected to the load.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

In charge pump arrangements where two different voltage levels are generated through a diode-connected transistor and the regulation is from the bottom branch, the level of the upper branch can result in a lower regulated level and slow recovery when the load is connected to top branch.

Figure 1A:
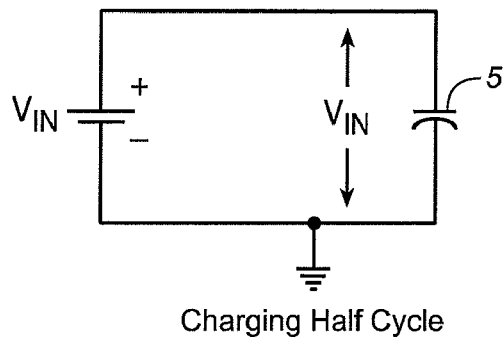
FIG. 1a is a simplified circuit diagram of the charging half cycle in a generic charge pump.
Figure 1B:
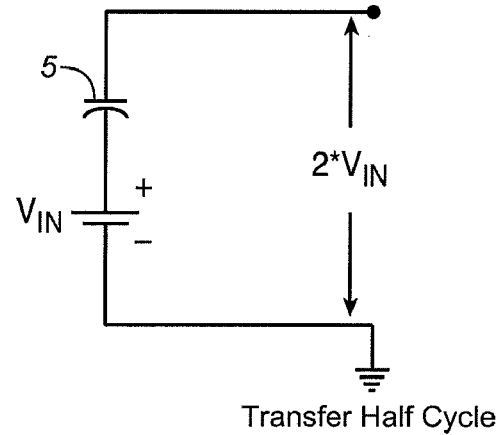
FIG. 1b is a simplified circuit diagram of the transfer half cycle in a generic charge pump.
Figure 2:
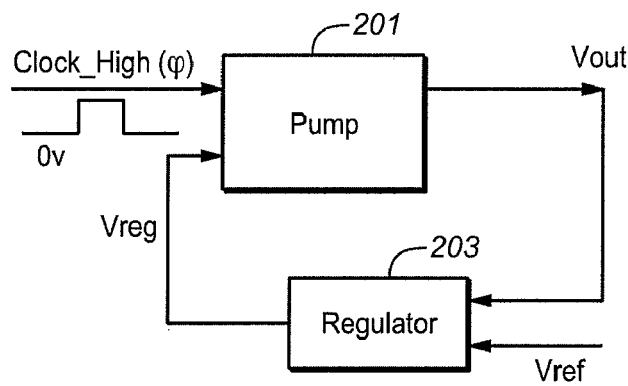
FIG. 2 is a top-level block diagram for a regulated charge pump.

FIG. 2 is a top-level block diagram of a typical charge pump arrangement. As shown in FIG. 201, the charge pump 201 has as inputs a clock signal and a voltage Vreg and provides an output Vout. The voltage Vreg is provided by the regulator 203, which has as inputs a reference voltage Vref and Vout. The regulator block 203 regulates the value of Vreg such that k*Vout=Vref, where, by adjusting the value of k, the desired value of Vout can be obtained. The value k can be implemented as, for example, a resistor ratio and is typically adjusted through a digital to analog converter, as will be familiar in the art. (Although not shown, the regulator (203) will also be connected to receive the voltage Vext from the external power supply to the chip. Regulator 203 can take other supply voltages, not just Vext.

Vref is a fixed reference value, such as provided by bandgap generator (not shown) with a voltage of, say, 1.2 volts. Clock_High is a clock (not shown) input to the Pump 201.

Figure 3:
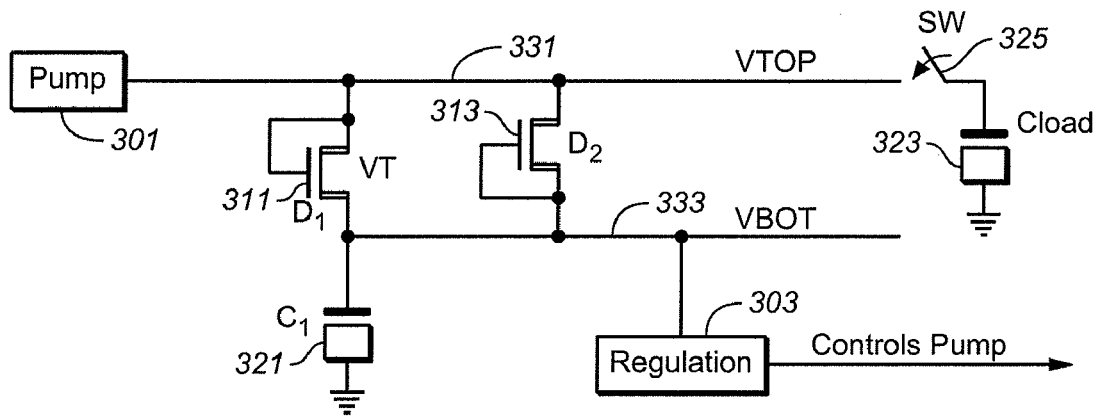
FIG. 3 shows a charge pump arrangement to generate two different voltage levels through a diode-connected transistor.
Figure 6:
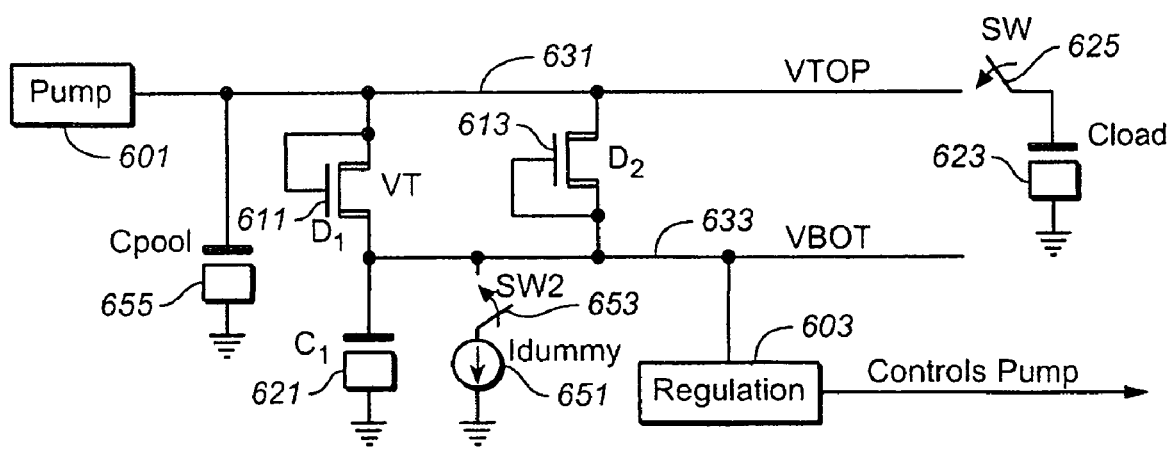
FIG. 6 shows an exemplary embodiment of a charge pump arrangement to generate two different voltage levels through a diode-connected transistor that incorporates improvements described.

More information on prior art charge pumps that can be used for charge pump 201, as well as for those in FIGS. 3 and 6, such Dickenson type pumps and charge pumps generally, can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Other example that can be used can be found in U.S. Pat. Nos. 5,436,587; 6,370,075; 6,922,096; and 7,135,910; and applications Ser. No. 10/842,910 filed on May 10, 2004; Ser. No. 11/295,906 filed on Dec. 6, 2005; Ser. No. 11/303,387 filed on Dec. 16, 2005; Ser. No. 11/497,465 filed on Jul. 31, 2006; Ser. No. 11/523,875 filed on Sep. 19, 2006; an application entitled "Low Voltage Charge Pump with Regulation", by Feng Pan, Jonathan H. Huynh and Qui Vi Nguyen, filed concurrently with the present application; and Ser. No. 11/845,903 and Ser. No. 11/845,939, both filed Aug. 28, 2007.

FIG. 3 shows a charge pump connected to generate two different voltage levels through a diode-connected transistor. The output of charge pump 301 is connected to a first line 331 to supply a first output voltage VTOP, corresponding to Vout in FIG. 2. A switch SW 325 schematically indicates the ability to connect VTOP to drive a load, here indicated as a capacitive load Cload 323. This load could correspond, for example, to some high voltage switches to pass VBOT voltage.

The arrangement of FIG. 3 also provides a second output level VBOT along line 333. The second output level VBOT is offset relative VTOP by an offset voltage (the threshold voltage of diode) to place it at a lower level. In the exemplary embodiment, this is effected by placing a diode D1 311 having a voltage drop of VT so that VTOP=VBOT+VT. The diode can be implemented in the various ways familiar to those in the art, such as BJT or CMOS versions. In the example, D1 311 is a diode connected NMOS whose threshold voltage is VT. The exemplary embodiment also includes the additional diode D2 313, allowing current to flow back to 331 should its level drop low enough, and a capacitor C1 321 connected between 333 and ground to store charge for the second output on 333.

The ability to provide two output voltages as in FIG. 3 can be quite useful in a number of applications where charge pumps are used. The derivation of one of these outputs from the other allows the relative difference between these two be maintained at a more or less fixed amount, at least when these voltages are in equilibrium. For example, in the operation of off non-volatile memories, there are often cases where two voltages levels offset by a given amount are needed, such as in the operation of a NAND-type chain structure of memory cells where a Vpass, or pass voltage, is applied to non-selected word lines and needs to raised relative the selected word lines. (Memory devices with such NAND chain structures are described in U.S. Pat. Nos. 5,570,315, 5,903,495, 6,046,935.) As the amount of need offset between VTOP and VBOT will be dependent upon the devices to which they are supplied, using a similarly formed device, such as a diode connected transistor, can closely match the appropriate amount of voltage offset to pass the voltage. Of course, two separate charge pump circuits could be used to provide the two levels VTOP and VBOT, but this would increase the amount of circuitry and complexity and the two levels may not track each other by the desired voltage difference. Using one pump 301 with a single regulation 303 and a device formed from the appropriate technology, here the diode connected transistor 311, to provide the voltage offset between the levels consequently has a number of advantages. Although only two levels are shown in FIG. 3 (and, below, in FIG. 6), additional levels could similarly be provided.

In FIG. 3, the regulation circuitry 303 is connected to receive the second, lower output voltage VBOT, which is the typical arrangement. Although the regulation could be based on both of VTOP and VBOT, this would introduce additional circuitry and complexity. Alternately, the regulation could be based on VTOP alone; however, as VBOT is often more critical in term of accuracy in design, it is usually preferred to directly regulate off of the lower VBOT value, with the VTOP value being indirectly regulated. Consequently, when a load (not shown) is driven by the second output on 333, the regulation 303 will respond to any drop in the value of VBOT. When load Cload 323 is driven by VTOP by closing of SW 325, the regulator 303 will respond only to the extent to which any change in VTOP is reflected in VBOT. This response to a drop in VTOP is, under the arrangement of FIG. 3, typically less than ideal.

In the arrangement of FIG. 3, as the regulation is based on VBOT, a dip in VTOP will often not be reflected in VBOT. More specifically, for the arrangement of FIG. 3, the waveform of VTOP in response to a load can be divided into 2 cases: In a first case, if the VTOP drop is still above VBOT-Vt, Vtop will stuck at a lower level after switching, and only start to recover after VBOT is out of regulation. In the second case, if VTOP drop below VBOT-Vt, then VBOT will be out of regulation by default and exhibit a dip, resulting in the VBOT and VTOP (as VBOT is only brought up by raising VTOP) being brought back to the desired level.

Figure 4:
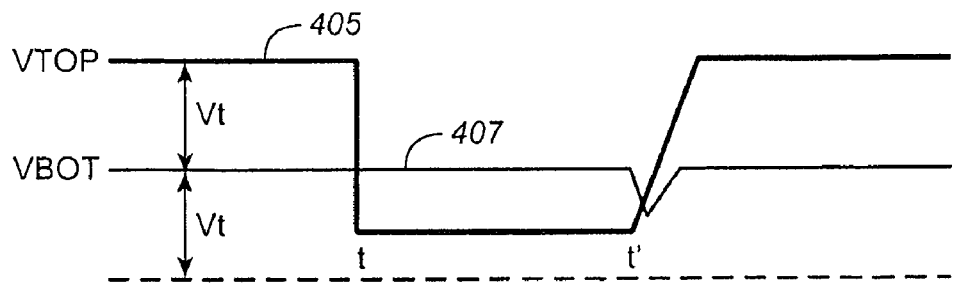
FIG. 4 shows a non-ideal recovery case when a load is driven.

FIG. 4 shows the non-ideal recovery for this first case once Cload is connected to VTOP at a time indicated by t. As shown, the level on VTOP 405 takes a dip as the load is connected; however, under the arrangement of FIG. 3, this dip is not reflected in VBOT 407, which maintains its level after the dip at t. As the regulation is based on VBOT, the pump will only turn on and off based on VBOT; and as VTOP has not dropped far enough (to below VBOT-VT) to take also VBOT out of regulation, VTOP could stay at this level indefinitely. Only once VBOT 407 falls out of the desired range, such as when a load is also attached there, and will both level begin to be pumped. This is shown at a time indicated by t'. Only once VBOT dips will the pump begins to pull both VBOT and VTOP back up.

Figure 5:
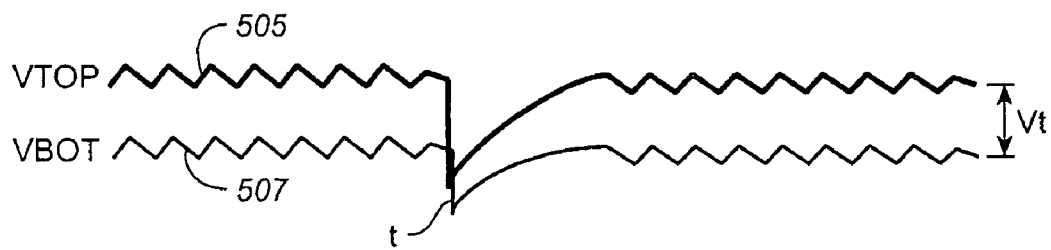
FIG. 5 shows an ideal recovery case when a load is driven.

FIG. 5 illustrates an ideal recovery case once Cload 323 is connected. As shown, VTOP 505 and VBOT 507 are initially at their more or less desired level, separated by VT. At a time again indicated by t, Cload is connected to VTOP, causing VTOP to dip. In order for the regulation circuitry to be aware of this dip and cause the pump to quickly restore the VTOP level, the input to the regulator, namely VBOT, should also dip as VTOP dips. Under the arrangement of FIG. 3, however, the recovery is the non-ideal behavior shown in FIG. 4.

FIG. 6 shows several aspects of an exemplary embodiment allowing the indirect regulation of VBOT to more closely resemble the ideal recovery of FIG. 5 by inducing a dip in VBOT 507 at time t when Cload is connected to VTOP.

FIG. 6 again includes charge pump 601 providing a first output level VTOP along line 631 to a load Cload 623 through switch SW 625 and also providing a second output level VBOT by way of diode D1 611 along line 633, from which the regulator circuitry 603 takes its input. The optional, but commonly preferred, elements C1 621 and D2 613 are again included. It is again noted that although D2 613 allows current to flow from 633 to 631, in the case of a dip in VTOP, the drop may not be large enough to case any flow through D2 613; and even if these is some flow, this may not cause enough of a drop in VBOT to turn on the pump in terms of the recovery time specification for VTOP.

To help resolve the problems described with respect to FIG. 4, FIG. 6 adds a current source Idummy 651 that is enabled and connected to VBOT though a switch SW2 653 (control circuitry not shown) when a load is connected to VTOP. This causes VBOT to fall below the regulation threshold, thus enabling the pump 601 to turn on and charge up VTOP. The current source 651 can realized in any of the standard form for such pull-down elements will have feedback so that it can be turned off after VBOT is brought back up to its value. The control circuitry can enable and/or connect the current source 651 based upon the same control signal used to enable the switch SW 625 or otherwise in response to determining that the load has connected. This arrangement can be particularly useful when VBOT has capacitive regulation. The exemplary embodiment also adds a pool capacitor Cpool 655 connected between 631 and ground. This can help to reduce noise on VBOT to prevent accidentally turn off PUMP 601 before VTOP reaches regulation.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A circuit, comprising:
    a charge pump;
    a first output signal connected to receive an output of the charge pump and connectable to a load through a first switch;
    a first diode connected to provide a second output signal of lower voltage from the first output signal;
    regulation circuitry connected to receive the second output signal and connectable to the charge pump to regulate the output thereof;
    a second switch coupled to receive the second output signal; and
    a current source connected between the second switch and ground; and
    whereby the second switch connects the current source to receive the second output signal in response to the connection of the first switch to the load.

2. The circuit of claim 1, further comprising:
    a second diode connected to allow current to flow from the second output signal to the first output signal.

3. The circuit of claim 1, wherein the first diode is a diode connected transistor.

4. The circuit of claim 1, further comprising:
    a capacitor connected between the second output signal and ground.

5. The circuit of claim 1, further comprising:
    a capacitor connected between the first output signal and ground.

6. The circuit of claim 1, wherein the load is a capacitive load.

7. The circuit of claim 1, wherein the second switch disconnects the current source from the second output signal based in response to the second output signal reaching a predetermined level.

8. The circuit of claim 1, wherein the circuit is a non-volatile memory circuit and said charge pump, first diode, regulation circuitry, a switch and current source are formed as peripheral circuitry thereupon.

9. A method of operating a circuit including a charge pump and a regulator connectable to the charge pump to regulate an output thereof, the method comprising:
    providing the output of said charge pump as a first output signal therefrom to a load through a first switch;
    connecting said output of the charge pump to a first diode and deriving as output therefrom a second output signal of lower voltage than the first output signal;
    supplying the second output signal as input to the regulator to regulate the output of the charge pump in response thereto;
    connecting the first output signal to the load using said first switch; and
    in response to connecting the first output signal to the load, enabling a current source between the second output signal and ground using a second switch.

10. The method of claim 9, wherein the circuit further includes a second diode connected to allow current to flow from the second output signal to the first output signal.

11. The method of claim 9, wherein the first diode is a diode connected transistor.

12. The method of claim 9, wherein the circuit further includes a capacitor connected between the second output signal and ground.

13. The method of claim 9, wherein the circuit further includes a capacitor connected between the first output signal and ground.

14. The method of claim 9, wherein the load is a capacitive load.

15. The method of claim 9, wherein second switch disconnects the current source in response to the second output signal reaching a predetermined level.

16. A method of operating a charge pump, comprising:
    deriving from an output of the charge pump a second output of lower voltage using a diode;
    regulating the output of the charge pump based on the second output using a regulator;
    connecting the output of the charge pump to a load using a first switch; and
    in response to connecting the output of the charge pump the load, connecting a current source connected between the second output and ground using a second switch.

17. The method of claim 16, wherein the current source is enabled based on a signal controlling the connection of the output of the charge pump to the load.

18. The method of claim 16, wherein the current source is disabled in response to the second output reaching a predetermined level.

* * * * *

UNITED STATES PATENT AND TRADEMARK OFFICE
CERTIFICATE OF CORRECTION

PATENT NO. : 7,586,363 B2
APPLICATION NO. : 11/955237
DATED : September 8, 2009
INVENTOR(S) : Feng Pan et al.

It is certified that error appears in the above-identified patent and that said Letters Patent is hereby corrected as shown below:

Column 6, line 15, please delete "enabling" and insert -- connecting --.

Signed and Sealed this

Third Day of November, 2009

David J. Kappos
*Director of the United States Patent and Trademark Office*